United States Patent
Kim et al.

(10) Patent No.: US 8,049,283 B2
(45) Date of Patent: Nov. 1, 2011

(54) SEMICONDUCTOR DEVICE WITH DEEP TRENCH STRUCTURE

(75) Inventors: Do Hyung Kim, Chungbuk (KR); Yong Gyu Lim, Chungbuk (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 364 days.

(21) Appl. No.: 12/318,302

(22) Filed: Dec. 24, 2008

(65) Prior Publication Data

US 2009/0166744 A1 Jul. 2, 2009

(30) Foreign Application Priority Data

Dec. 28, 2007 (KR) .................. 10-2007-0140352

(51) Int. Cl.
*H01L 27/092* (2006.01)
(52) U.S. Cl. ........ 257/371; 257/365; 257/369; 257/372; 257/374; 257/E27.067
(58) Field of Classification Search ............ 257/365, 257/371, 372, 374, E27.067
See application file for complete search history.

(56) References Cited

U.S. PATENT DOCUMENTS

| | | | | |
|---|---|---|---|---|
| 6,140,170 A * | 10/2000 | Shibib | ............ | 438/203 |
| 6,222,233 B1 * | 4/2001 | D'Anna | ............ | 257/343 |
| 6,310,385 B1 * | 10/2001 | Ajit | ............ | 257/524 |
| 6,404,011 B2 * | 6/2002 | Kim et al. | ............ | 257/341 |
| 7,821,075 B2 * | 10/2010 | Snyder et al. | ............ | 257/371 |
| 2001/0045615 A1 * | 11/2001 | Ajit | ............ | 257/523 |
| 2002/0005562 A1 * | 1/2002 | Kim et al. | ............ | 257/510 |
| 2008/0173949 A1 * | 7/2008 | Ma et al. | ............ | 257/371 |
| 2008/0191277 A1 * | 8/2008 | Disney et al. | ............ | 257/343 |
| 2008/0237704 A1 * | 10/2008 | Williams et al. | ............ | 257/338 |
| 2009/0261446 A1 * | 10/2009 | Gogoi | ............ | 257/500 |
| 2010/0052052 A1 * | 3/2010 | Lotfi et al. | ............ | 257/336 |

FOREIGN PATENT DOCUMENTS

| | | |
|---|---|---|
| KR | 10-2002-0056275 | 7/2002 |
| KR | 10-2006-0093180 | 8/2006 |

* cited by examiner

*Primary Examiner* — Victor A Mandala
(74) *Attorney, Agent, or Firm* — NSIP Law

(57) ABSTRACT

Disclosed herein is a semiconductor device with a deep trench structure for effectively isolating heavily doped wells of neighboring elements from each other at a high operating voltage. The semiconductor device with a deep trench structure includes a semiconductor substrate in which a first conductivity type well and a second conductivity type well having conductivity opposite to that of the first conductivity type well are formed, a gate oxide film and a gate electrode laminated on each of the first conductivity type well and the second conductivity type well, second conductivity type drift regions formed on both sides of the gate electrode formed on the first conductivity type well, first conductivity type drift regions formed on both sides of the gate electrode formed on the second conductivity type well, and a first isolation layer having a trench structure deeper than the first and second conductivity type wells and isolating the first conductivity type well and the second conductivity type well from each other.

16 Claims, 5 Drawing Sheets

【Fig. 1】
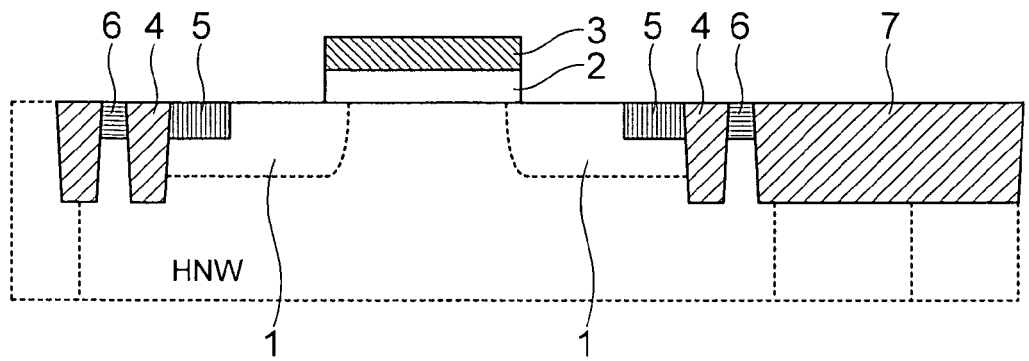
【Fig. 2】
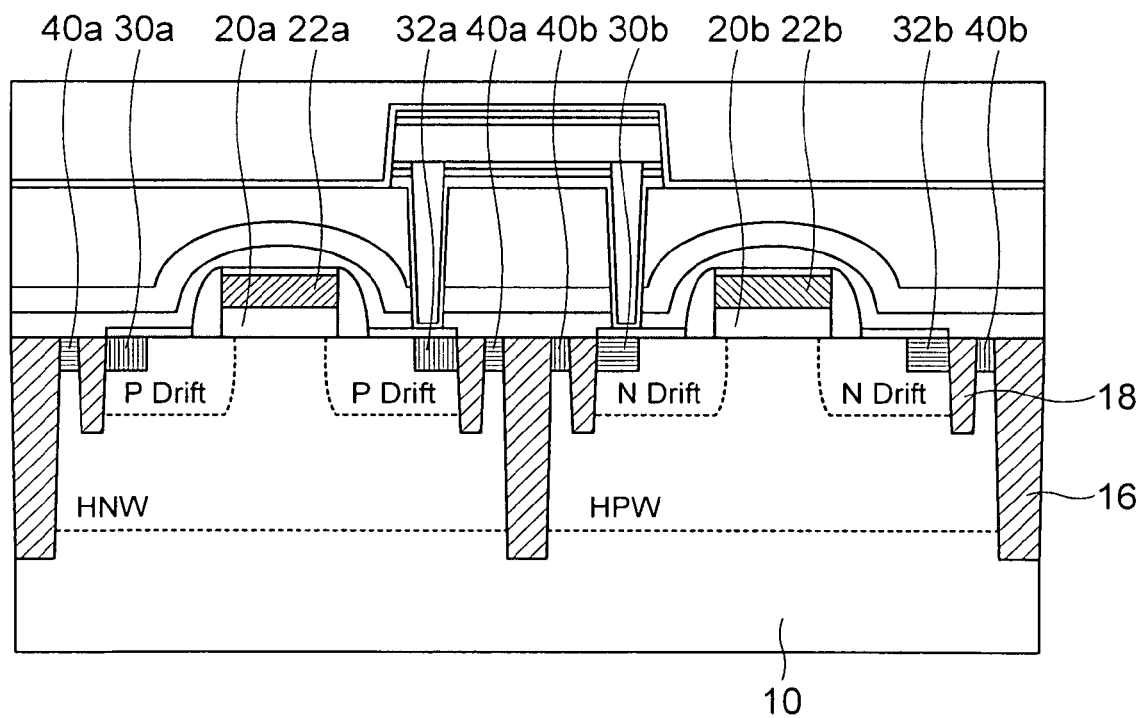

[Fig. 3]
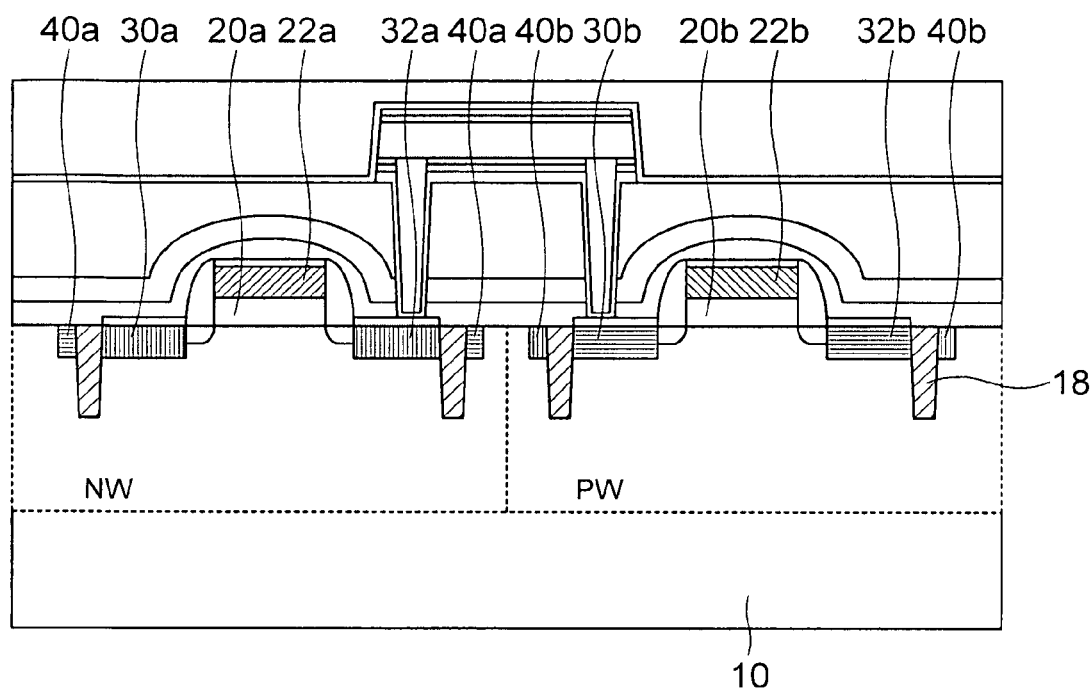
[Fig. 4a]
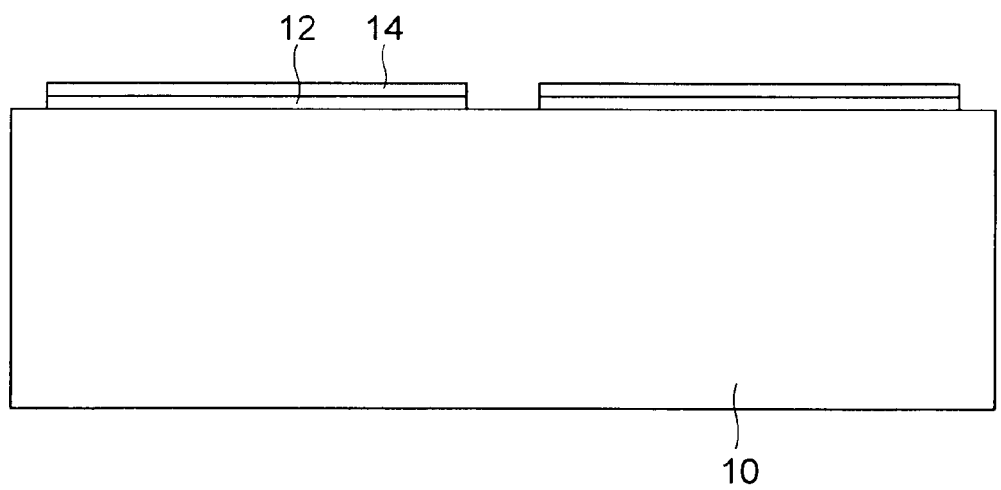

[Fig. 4b]
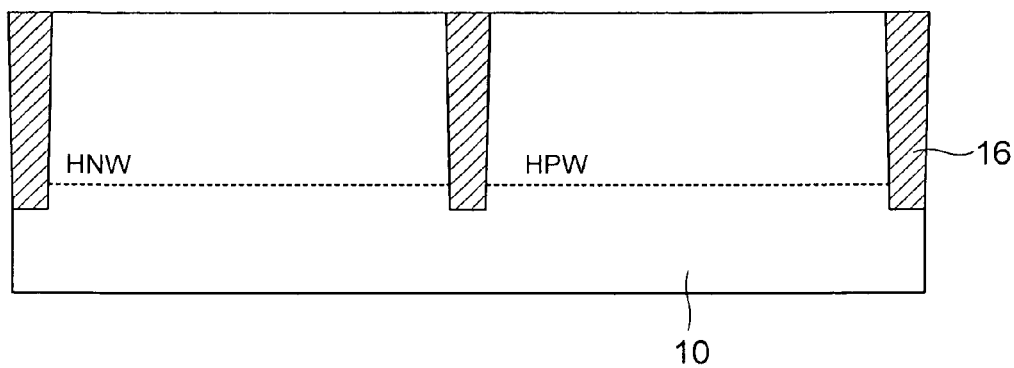
[Fig. 4c]
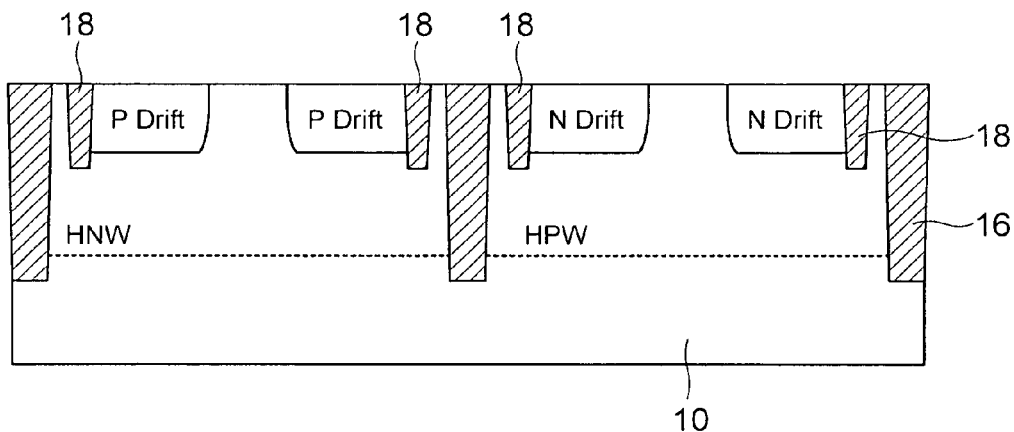

[Fig. 4d]
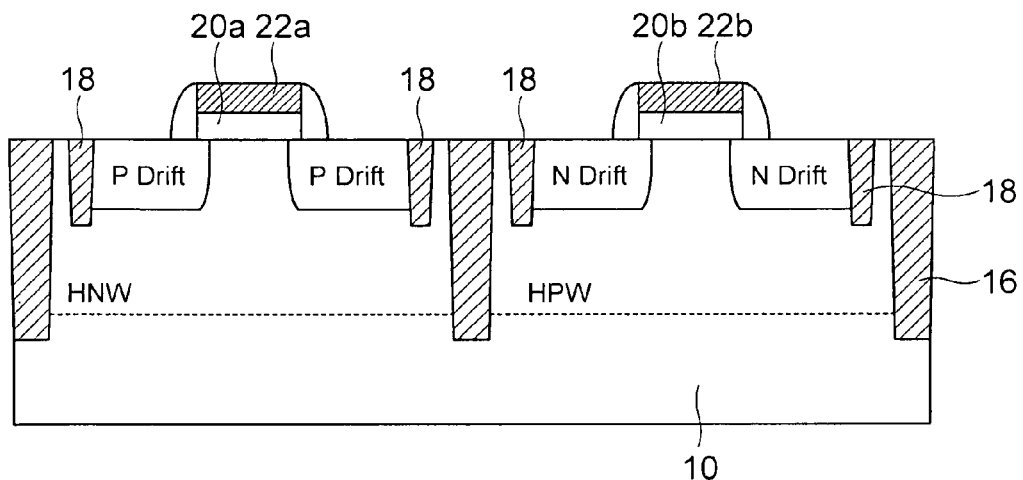
[Fig. 4e]
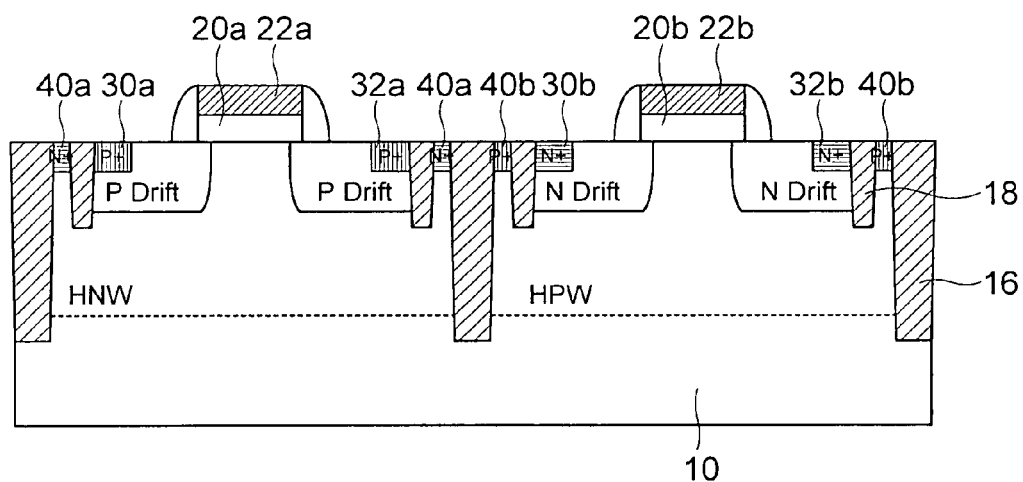

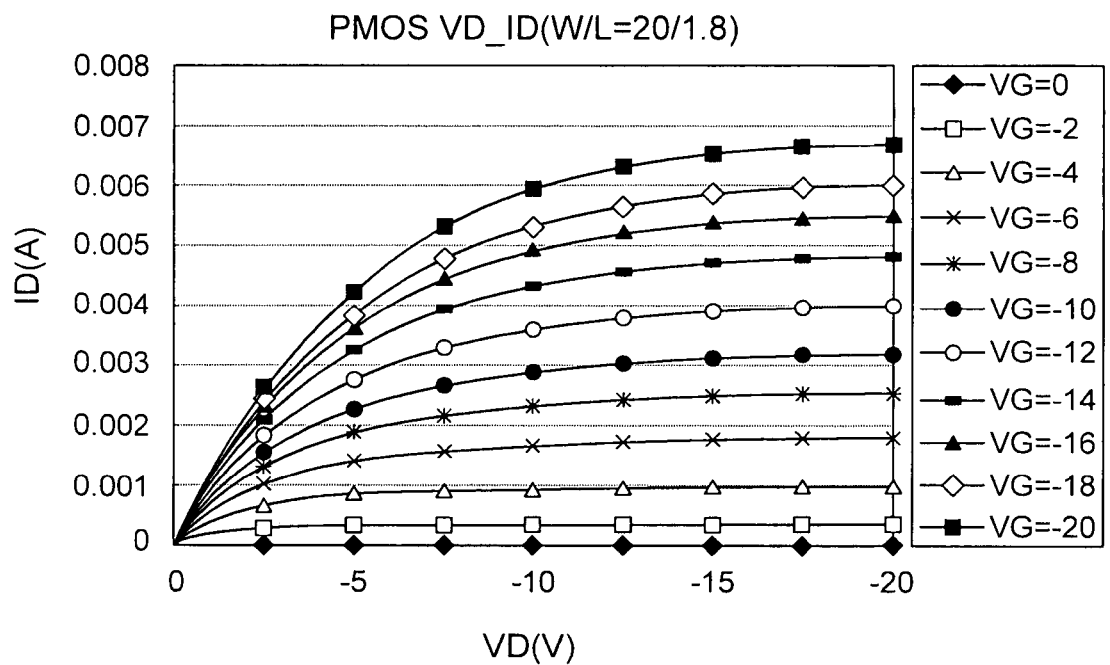
[Fig. 5]

SEMICONDUCTOR DEVICE WITH DEEP TRENCH STRUCTURE

CROSS-REFERENCE TO RELATED APPLICATION

This application claims the benefit under 35 U.S.C. §119 (a) of Korean Patent Application No. 10-2007-140352 filed on Dec. 28, 2007, in the Korean Intellectual Property Office, the entire disclosure of which is incorporated herein by reference for all purposes.

BACKGROUND OF THE INVENTION

1. Field of the Invention

The present invention relates to a semiconductor device with a deep trench structure and, more particularly, to a semiconductor device with a deep trench structure for effectively isolating heavily doped wells of neighboring elements from each other at a high operating voltage.

2. Background of the Related Art

As integrated circuits having various functions coexist in the same product because of high integration of semiconductor circuits, a multi-voltage/current driving high voltage transistor is required.

A thin film transistor-liquid crystal display (TFT-LCD) includes a driving circuit and a control circuit. The control circuit has a logic circuit operating at 5V and the driving circuit has a high voltage transistor operating at higher than 30V, and thus the TFT-LCD cannot be manufactured using a standard complementary metal oxide semiconductor (CMOS) process. Furthermore, when a high voltage device manufacturing process is applied to the TFT-LCD, power consumption of the control circuit and the size of the TFT-LCD increase.

To solve these problems, there is proposed a method of adding a mask process and an ion implantation process to a 1.2 µm logic manufacturing process to easily control voltage and current levels without changing characteristics of logic elements.

Meanwhile, a conventional high voltage device employs deep wells in order to endure a high voltage. In this case, it is difficult to isolate neighboring wells from each other as an operating voltage of the high voltage element increases.

Referring to FIG. 1, drift regions 1 are formed in a substrate having a high voltage well HNW formed therein and a gate oxide 2 and a gate electrode 3 are formed thereon. Source and drain regions 5 are respectively formed in the drift regions 1 having the gate electrode 3 formed therebetween and bulk ion implanted regions 6 are formed in the high voltage well HNW. The source and drain regions 5 are respectively isolated from the bulk ion implanted regions 6 according to a narrow isolation layer 4.

Here, although the source and drain regions 5 can be respectively isolated from the bulk ion implanted regions 6 using the narrow isolation layer 4, a wide isolation layer 7 should be formed in order to isolate the high voltage well HNW because the isolation layer 7 has a shallow trench structure in a high voltage device having a high operating voltage, as illustrated in FIG. 1. This increase the size of the high voltage device, and thus the high voltage device is not suitable for a driving IC.

That is, the increase in the size of the high voltage device causes an increase in the device cost and deterioration of integration, and thus the high voltage device is not suitable to be used as a driving IC because current devices require a small size, high integration and low cost.

SUMMARY OF THE INVENTION

Accordingly, the present invention has been made in view of the above-mentioned problems occurring in the prior art, and it is a general aspect of the present invention to provide a semiconductor device with a deep trench structure and a method of manufacturing the same for forming an isolation layer having a trench structure deeper than wells and isolating source and drain regions formed drift regions using an isolation layer having a shallow trench structure to effectively isolate wells of PMOS and NMOS regions requiring a high operating voltage from each other.

To accomplish general aspects of the present invention, according to the present invention, there is provided a semiconductor device with a deep trench structure, which includes a semiconductor substrate in which a first conductivity type well and a second conductivity type well having conductivity opposite to that of the first conductivity type well are formed; a gate oxide film and a gate electrode laminated on each of the first conductivity type well and the second conductivity type well; second conductivity type drift regions formed on both sides of the gate electrode formed on the first conductivity type well; first conductivity type drift regions formed on both sides of the gate electrode formed on the second conductivity type well; and a first isolation layer having a trench structure deeper than the first and second conductivity type wells and isolating the first conductivity type well and the second conductivity type well from each other.

To accomplish the above object of the present invention, according to the present invention, there is provided a semiconductor device with a deep trench structure, which includes a semiconductor substrate in which a first conductivity type well and a second conductivity type well having conductivity opposite to that of the first conductivity type well are formed; a gate oxide film and a gate electrode laminated on each of the first conductivity type well and the second conductivity type well; second conductivity type drift regions formed on both sides of the gate electrode formed on the first conductivity type well; first conductivity type drift regions formed on both sides of the gate electrode formed on the second conductivity type well; and a first isolation layer having a trench structure deeper than the first and second conductivity type wells and isolating the first conductivity type well and the second conductivity type well from each other.

The semiconductor device with a deep trench structure further includes first conductivity type source and drain regions respectively formed in the first conductivity type drift regions having the gate electrode formed therebetween; second conductivity type source and drain regions respectively formed in the second conductivity type drift regions having the gate electrode formed therebetween; second conductivity type bulk ion implanted regions respectively formed in close proximity to the first conductivity type source and drain regions in the first conductivity type well; first conductivity type bulk ion implanted regions respectively formed in close proximity to the second conductivity type source and drain regions in the second conductivity type well; and a second isolation layer having a trench structure shallower than the first isolation layer and electrically isolating each of the first and second conductivity type source and drain regions from each of the first and second conductivity type bulk ion implanted regions.

The first conductivity type may correspond to an N type and the second conductivity type may correspond to a P type.

To accomplish general aspects of the present invention, according to the present invention, there is provided a method of manufacturing a semiconductor device with a deep trench structure, which includes the steps of: forming a first isolation layer having a deep trench structure in a semiconductor substrate to isolate an NMOS region and a PMOS region from each other; forming a P well shallower than the first isolation layer in the NMOS region and forming an N well shallower than the first isolation layer in the PMOS region; forming N type drift regions in the P well and forming P type drift regions in the N well; and forming a gate oxide and a gate electrode in each of the NMOS region and the PMOS region.

The method of manufacturing a semiconductor device with a deep trench structure further includes the steps of: forming a second isolation layer having a trench structure shallower than the first isolation layer on the edge of each of the drift regions; respectively forming source and drain regions in the drift regions; and forming bulk ion implanted regions isolated from the source and drain regions according to the second isolation layer.

The present invention isolates heavily doped wells using an isolation layer having a deep trench structure at a high operating voltage so as to highly integrate a semiconductor device having the wells and reduce the size of the semiconductor device to decrease the cost thereof.

BRIEF DESCRIPTION OF THE DRAWINGS

The above and other features and aspects of the present invention will be apparent from the following detailed description of example embodiments of the invention in conjunction with the accompanying drawings, in which:

FIG. 1 is a cross-sectional view illustrating a high voltage region of a conventional semiconductor device;

FIG. 2 is a cross-sectional view illustrating a high voltage region of a semiconductor device with a deep trench structure according to an embodiment of the present invention;

FIG. 3 is a cross-sectional view illustrating a low voltage region of the semiconductor device with a deep trench structure according to an embodiment of the present invention;

FIGS. 4a through 4e are cross-sectional views illustrating a method of manufacturing a semiconductor device with a deep trench structure according to an embodiment of the present invention; and FIG. 5 is a graph illustrating a current-voltage (I-V) curve of a PMOS of the semiconductor device with a deep trench structure according to an embodiment of the present invention.

DETAILED DESCRIPTION OF THE PREFERRED EMBODIMENT

FIG. 2 is a cross-sectional view illustrating a high voltage region of a semiconductor device with a deep trench structure according to an embodiment of the present invention and FIG. 3 is a cross-sectional view illustrating a low voltage region of the semiconductor device with a deep trench structure illustrated in FIG. 2. Detailed explanation of the low voltage region will be omitted.

Referring to FIG. 2, a semiconductor substrate 10 is divided into a PMOS region and an NMOS region according to a first isolation layer 16 having a deep trench structure and an N well HNW and a P well HPW of opposite conductivity types are respectively formed in the PMOS region and the NMOS region. A gate oxide film 20a and a gate electrode 22a are laminated on the N well HNW and a gate oxide film 20b and a gate electrode 22b are laminated on the P well HPW.

P type drift regions P Drift doped with ions having conductivity opposite to the N well HNW are respectively formed on both sides of the gate electrode 22a in the N well HNW and N type drift regions N Drift doped with ions having conductivity opposite to the P well HPW are respectively formed on both sides of the gate electrode 22b in the P well HPW.

P type source and drain regions 30a and 32a are respectively formed in the P type drift regions P Drift having the gate electrode 22a formed therebetween. N type source and drain regions 30b and 32b are respectively formed in the N type drift regions N Drift having the gate electrode 22b formed therebetween.

For example, the P type source region 30a is formed in the P type drift region P Drift formed at one side of the gate electrode 22a of the PMOS region and the P type drain region 32a is formed in the P type drift region P Drift formed at the other side of the gate electrode 22a. In addition, the N type drain region 32b is formed in the N type drift region N Drift formed at one side of the gate electrode 22b of the NMOS region and the N type source region 30b is formed in the N type drift region N Drift formed at the other side of the gate electrode 22b.

A second isolation layer 18 shallower than the first isolation layer 16 is formed on the edge of each drift region. Here, the first isolation layer 16 has a depth in the range of 3 to 6 μm and a width in the range of 0.4 to 1.3 μm and the second isolation layer 18 has a depth in the range of 0.7 to 1.5 μm and a width in the range of 0.3 to 1.0 μm.

Bulk ion implanted regions 40a and 40b are respectively formed in the N well HNW and the P well HPW and isolated from the source and drain regions 30a and 32a and the source and drain regions 33b and 32b according to the second isolation layer 18. Here, the bulk ion implanted regions 40a and 40b are used for pickup of the N well HNW and the P well HPW and respectively doped with ions having the same conductivities as those of the N well HNW and the P well NPW.

As described above, the present invention forms the isolation layer 16 having a trench structure deeper than the wells HNW and HPW to effectively electrically isolate the wells HNW and HPW from each other so as to reduce the size of the semiconductor device and improve the integration of the semiconductor device which requires a high operating voltage.

FIGS. 4a through 4e are cross-sectional views illustrating a method of manufacturing a semiconductor device with a deep trench structure according to an embodiment of the present invention.

Referring to FIG. 4a, a pad oxide film 12 and a pad nitride film 14 are sequentially formed on a semiconductor substrate 10 and then the pad nitride film 14 and the pad oxide film 12 are sequentially etched to define an isolation region.

Referring to FIG. 4b, the semiconductor substrate 10 is etched to a predetermined depth using the pad nitride film 14 has a hard mask to form a deep trench. A predetermined isolation process is formed to bury the deep trench and planarize the deep trench so as to form a first isolation layer 16 having a depth in the range of 3 to 6 μm and a width in the range of 0.4 to 1.3 μm to thereby isolate an NMOS region and a PMOS region from each other.

For example, the pad nitride film 14 is removed, and then a sidewall oxide film (not shown) having a thickness in the range of 100 to 300 Å, preferably, 200 Å, is formed on the inner wall of the deep trench at a temperature in the range of 900 to 1200° C., preferably, 1050° C., through dry oxidation. Then, an HLD oxide layer (not shown) is formed by a thickness in the range of 1500 to 2500 Å, preferably, 2000 Å, and a polysilicon gap filling process and an etchback wet oxidation process are performed. Subsequently, an oxide film having a thickness in the range of 1000 to 2000 Å, preferably, 1500 Å, is formed through wet oxidation at a temperature in the range of 900 to 110° C., preferably, 1000° C.

An N well HNW and a P well HPW shallower than the first isolation layer 16 are respectively formed in the PMOS region and the NMOS region isolated from each other according to the first isolation layer 16.

For example, the NMOS region is masked with a photoresist pattern and high-concentration N type impurities are ion-implanted to form the N well HNW in the PMOS region. The PMOS region is masked with a photoresist pattern and high-concentration P type impurities are ion-implanted to form the P well HPW in the NMOS region.

Referring to FIG. 4c, P type drift regions P Drift and N type drift regions N Drift are respectively formed in the N well HNW and the P well HPW, and then heat treatment is performed to diffuse ions implanted into the P type drift regions P Drift and the N type drift regions N Drift.

For example, only predetermined portions of the surface of the N well HNW are exposed using a photoresist pattern and P type impurity ions are lightly implanted into the N well HNW to form the P type drift regions P Drift. In addition, only predetermined portions of the surface of the P well HPW are exposed using a photoresist pattern and N type impurity ions are lightly implanted into the P well HNW to form the N type drift regions N Drift.

Subsequently, a second isolation layer 18 that has a depth in the range of 0.7 to 1.5 μm and a width in the range of 0.3 to 1.0 μm and is shallower than the first isolation layer 16 is formed on the edge of each of the P type and N type drift regions through photolithography.

Here, the second isolation layer 18 is formed using a conventional isolation process including an etch process using a hard mask, a process of forming a sidewall oxide, a process of forming a liner oxide, a process of forming a buffer oxide, a process of forming HLD and HDP oxide films, a chemical mechanical polishing process and an HLD annealing process.

Referring to FIG. 4d, an oxide layer and a polysilicon layer are formed on the semiconductor substrate 10 and photolithography is carried out to form a gate oxide film 20a and a gate electrode 22a in the PMOS region and form a gate oxide film 20b and a gate electrode 22b in the NMOS region.

Referring to FIG. 4e, source and drain regions 30a and 32a are respectively formed in the P type drift regions P Drift formed on both sides of the gate electrode 22a and source and drain regions 30b and 32b are respectively formed in the N type drift regions N Drift formed on both sides of the gate electrode 22b.

For example, P type impurity ions are heavily implanted into the P type drift regions P Drift of the PMOS region to form the source and drain regions 30a and 32a located apart from each other by a predetermined distance having the gate electrode 22a formed therebetween. In addition, N type impurity ions are heavily implanted into the N type drift regions N Drift of the NMOS region to form the source and drain regions 30b and 32b located apart from each other by a predetermined distance having the gate electrode 22b formed therebetween.

Subsequently, bulk ion implanted regions 40a isolated from the source and drain regions 30a and 32a according to the second isolation layer 18 and bulk ion implanted regions 40b isolated from the source and drain regions 30b and 32b according to the second isolation layer 18 are respectively formed in the N well HNW and the P well HPW.

Thereafter, a conventional insulating layer forming process, a metal process and an interconnection process are performed.

FIG. 5 is a graph illustrating a current-voltage (I-V) curve of a PMOS of the semiconductor device having the deep trench structure according to an embodiment of the present invention.

Referring to FIG. 5, the semiconductor device having the deep trench structure according to the present invention can operate at a gate voltage (VG) of 20V and has excellent saturation current characteristic. This is because the deep trench is formed between the N well HNW and the P well HPW and thus the PMOS is effectively isolated from the NMOS and the semiconductor device can endure a breakdown voltage.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A semiconductor device with a deep trench structure, comprising:
    a semiconductor substrate, comprising:
        a first conductivity type well; and
        a second conductivity type well, the second conductivity being a conductivity that is opposite to a conductivity of the first conductivity;
    a first gate oxide film and a second gate oxide film formed respectively on the first conductivity type well and the second conductivity type well;
    a first gate electrode and a second gate electrode formed respectively on the first gate oxide film and the second gate oxide film;
    second conductivity type drift regions formed on both sides of the first gate electrode;
    first conductivity type drift regions formed on both sides of the second gate electrode;
    a first isolation layer having a trench structure with a depth that is greater than depths of the first and second conductivity type wells, the first isolation layer isolating the first conductivity type well and the second conductivity type well from each other; and
    one or more second isolation layers having a trench structure with a depth that is less than the depth of the trench structure of the first isolation layer, each of the second isolation layers being formed between the first isolation layer and a respective one of the drift regions.

2. The semiconductor device of claim 1, further comprising:
    first conductivity type source and drain regions respectively formed in the first conductivity type drift regions having the first gate electrode formed therebetween;
    second conductivity type source and drain regions respectively formed in the second conductivity type drift regions having the second gate electrode formed therebetween;
    second conductivity type bulk ion implanted regions respectively formed in close proximity to the first conductivity type source and drain regions in the first conductivity type well; and
    first conductivity type bulk ion implanted regions respectively formed in close proximity to the second conductivity type source and drain regions in the second conductivity type well, wherein the seconds isolation layers respectively isolate the first and second conductivity type source and drain regions from the first and second conductivity type bulk ion implanted regions.

3. The semiconductor device of claim 1, wherein the first conductivity type corresponds to N type and the second conductivity type corresponds to P type.

4. The semiconductor device of claim 1, wherein:
the depth of the trench structure of the first isolation layer is in a range of 3 to 6 µm; and
the trench structure of the first isolation layer has a width in a range of 0.4 to 1.3 µm.

5. The semiconductor device of claim 1, wherein:
the depth of the trench structure of the second isolation layers is in a range of 0.7 to 1.5 µm; and
the trench structure of the second isolation layers has a width in a range of 0.3 to 1.0 µm.

6. A method of manufacturing a semiconductor device with a deep trench structure, the method comprising:
forming a first isolation layer having a trench structure in a semiconductor substrate to isolate an NMOS region and a PMOS region from each other;
forming a P well in the NMOS region, the P well having a depth that is less than a depth of the trench structure of the first isolation layer;
forming an N well in the PMOS region, the N well having a depth that is less than the depth of the trench structure of the first isolation layer;
forming N type drift regions in the P well;
forming P type drift regions in the N well;
forming one or more second isolation layers having a trench structure with a depth that is less than the depth of the trench structure of the first isolation layer, each of the second isolation layers being formed between the first isolation layer and a respective one of the drift regions;
forming a gate oxide film in each of the NMOS region and the PMOS region; and
forming a gate electrode on the formed gate oxide film in each of the NMOS region and the PMOS region.

7. The method of claim 6, further comprising:
respectively forming source and drain regions in the drift regions; and
forming bulk ion implanted regions isolated from the source and drain regions by the second isolation layer,
wherein each of the second isolation layers is formed on an edge of each of the drift regions.

8. The method of claim 6, wherein the first conductivity type corresponds to N type and the second conductivity type corresponds to P type.

9. The method of claim 6, wherein:
the depth of the trench structure of the first isolation layer is in a range of 3 to 6 µm; and
the trench structure of the first isolation layer has a width in a range of 0.4 to 1.3 µm.

10. The method of claim 6, wherein:
the depth of the trench structure of the second isolation layers is in a range of 0.7 to 1.5 µm; and
the trench structure of the second isolation layers has a width in a range of 0.3 to 1.0 µm.

11. The semiconductor device of claim 2, wherein the first conductivity type corresponds to N type and the second conductivity type corresponds to P type.

12. The method of claim 7, wherein the first conductivity type corresponds to N type and the second conductivity type corresponds to P type.

13. The semiconductor device of claim 1, wherein the trench structure of the first isolation layer has a width that is tapered from an upper surface of the first and second conductivity type wells throughout the depth of the trench structure.

14. A semiconductor device with a deep trench structure, comprising:
a semiconductor substrate comprising a well;
a gate oxide film formed on the well;
a gate electrode formed on the gate oxide film;
one or more drift regions formed on opposite sides of the gate electrode;
one or more first isolation layers having a trench structure with a depth that is greater than a depth of the well, each of the drift regions being formed between the gate electrode and one of the first isolation layers; and
one or more second isolation layers having a trench structure with a depth that is less that the depth of the trench structure of the first isolation layer, each of the second isolation layers being formed between one of the first isolation layers and one of the drift regions.

15. The semiconductor device of claim 14, further comprising:
source and drain regions respectively formed in the drift regions having the gate electrode farmed therebetween; and
bulk ion implanted regions formed in close proximity to the source and drain regions in the well,
wherein each of the second isolation layers respectively isolate the source and drain regions from the bulk ion implanted regions.

16. The semiconductor device of claim 14, wherein the trench structure of each of the first isolation layers has a width that is tapered from an upper surface of the well throughout the depth of the trench structure.

* * * * *